(12) United States Patent
Ahn et al.

(10) Patent No.: US 10,840,115 B2
(45) Date of Patent: Nov. 17, 2020

(54) MICRO LED TRANSFER HEAD

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD, Asan (KR)

( * ) Notice: Subject to any disclaimer, the term of this patent is extended or adjusted under 35 U.S.C. 154(b) by 0 days.

(21) Appl. No.: 16/459,457

(22) Filed: Jul. 1, 2019

(65) Prior Publication Data

US 2020/0013648 A1 Jan. 9, 2020

(30) Foreign Application Priority Data

Jul. 6, 2018 (KR) .................. 10-2018-0078716

(51) Int. Cl.
*H01L 21/67* (2006.01)
*B65G 47/91* (2006.01)
*H01L 21/683* (2006.01)
*H01L 25/16* (2006.01)

(52) U.S. Cl.
CPC ........ *H01L 21/67144* (2013.01); *B65G 47/91* (2013.01); *H01L 21/6838* (2013.01); *H01L 25/167* (2013.01)

(58) Field of Classification Search
CPC ................................. H01L 21/67144
See application file for complete search history.

(56) References Cited

U.S. PATENT DOCUMENTS

2006/0228897 A1* 10/2006 Timans ............. H01L 21/67115
438/758
2018/0096878 A1* 4/2018 Wu ..................... H01L 33/0095

FOREIGN PATENT DOCUMENTS

| KR | 100731673 B1 | 6/2007 |
| KR | 20140112486 A | 9/2014 |
| KR | 20170019415 A | 2/2017 |
| KR | 20170024906 A | 3/2017 |
| KR | 20170026959 A | 3/2017 |
| KR | 101754528 B1 | 7/2017 |
| KR | 101757404 B1 | 7/2017 |

* cited by examiner

*Primary Examiner* — Ronald P Jarrett

(57) ABSTRACT

The present invention relates to a micro LED transfer head improving efficiency of transferring micro LEDs.

3 Claims, 5 Drawing Sheets

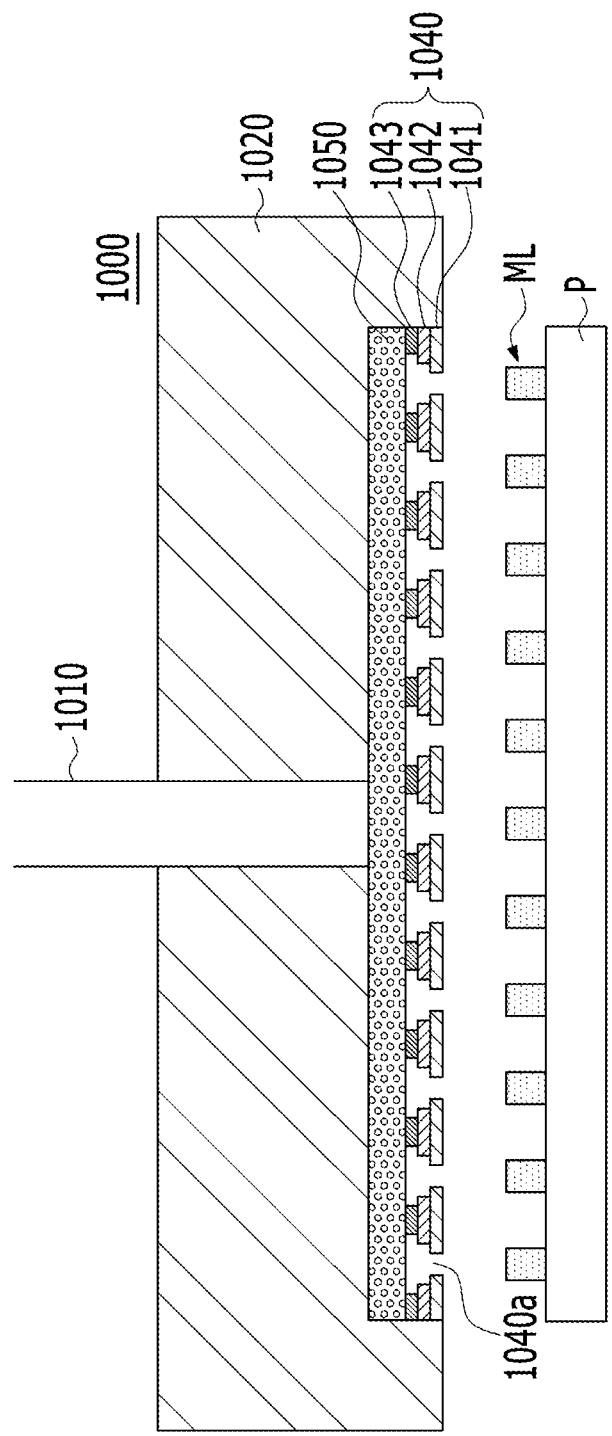

MICRO LED TRANSFER HEAD

CROSS REFERENCE TO RELATED APPLICATION

The present application claims priority to Korean Patent Application No. 10-2018-0078716, filed Jul. 6, 2018, the entire contents of which is incorporated herein for all purposes by this reference.

BACKGROUND OF THE INVENTION

Field of the Invention

The present invention relates to a micro LED transfer head transferring a micro light-emitting diode (micro LED) from a first substrate to a second substrate.

Description of the Related Art

Currently, the display market is still dominated by LCDs, but OLEDs are quickly replacing LCDs and emerging as mainstream products. In a current situation where display makers are rushing to participate in the OLED market, micro light-emitting diode (hereinafter, referred to as micro LED) displays have emerged as another next-generation display. Liquid crystal and organic materials are the core materials of LCDs and OLEDs, respectively, whereas the micro LED display uses 1 µm to 100 µm of an LED chip itself as light emitting material.

Since the term "micro LED" emerged in a patent "MICRO-LED ARRAYS WITH ENHANCED LIGHT EXTRACTION" in 1999 (Korean Patent No. 10-0731673, hereinafter referred to as 'Related Art 1') disclosed by Cree Inc., related research papers based thereon were subsequently published. In order to apply micro LEDs to a display, it is necessary to develop a customized microchip based on a flexible material and/or flexible device using a micro LED device, and techniques of transferring micrometer-sized LED chips and mounting the LED chips on a display pixel electrode are required.

Particularly, with regard to the transfer of the micro LED device to a display substrate, as the LED size is reduced to 1 µm to 100 µm, it is impossible to use a conventional pick-and-place machine, and a technology of a transfer head for higher precision is required. With respect to such a technology of a transfer head, several structures have been proposed as described below, but each of the proposed techniques has some problems.

Luxvue Technology Corp., USA, proposed a method of transferring a micro LED using an electrostatic head (Korean Patent Application Publication No. 10-2014-0112486, hereinafter referred to as 'Related Art 2'). A transfer principle of the Related Art 2 is that a voltage is applied to a head portion made of a silicone material so that the head portion comes into close contact with a micro LED due to electrification. However, this method may cause damage to micro LEDs due to electrification caused by the voltage applied to the head portion during induction of static electricity.

X-Celeprint Limited, USA, proposed a method of using an elastic polymer material as a transfer head and transferring a micro LED positioned to a wafer to a target substrate (P) (Korean Patent Application Publication No. 10-2017-0019415, hereinafter referred to as 'Related Art 3'). According to the Related Art 3, there is no damage to micro LEDs as compared with the above-mentioned electrostatic head. However, an adhesive force of the elastic transfer head is required to be higher than that of the target substrate (P) in the transfer process to transfer micro LEDs stably, and an additional process for forming an electrode is required. In addition, maintaining an adhesive force of the elastic polymer material is an important factor.

Korea Photonics Technology Institute proposed a method of transferring a micro LED using a ciliary adhesive-structured head (Korean Patent No. 10-1754528, hereinafter referred to as 'Related Art 4'). However, in the Related Art 4, it is difficult to manufacture a ciliary adhesive structure.

Korea Institute of Machinery and Materials has proposed a method of transferring a micro LED using a roller coated with an adhesive (Korean Patent No. 10-1757404, hereinafter referred to as 'Related Art 5'). However, the Related Art 5 has a problem in that continuous use of the adhesive is required, and micro LEDs may be damaged when pressed with the roller.

Samsung Display Co., Ltd proposed a method of transferring a micro-LED to an array substrate (P) according to electrostatic induction by applying a negative voltage to first and second electrodes of the array substrate (P) in a state where the array substrate (P) is immersed in a solution (Korean Patent Application Publication No. 10-2017-0026959, hereinafter referred to as 'Related Art 6'). However, the Related Art 6 has a problem in that a solution is required since micro LEDs are immersed in the solution to transfer to the array substrate (P), and a drying process is required.

LG Electronics Inc. proposed a method in which a head holder is disposed between multiple pick-up heads and a substrate (P) and a shape of the head holder is deformed by movement of the multiple pick-up heads such that the multiple pick-up heads are allowed to move freely (Korean Patent Application Publication No. 10-2017-0024906, hereinafter referred to as 'Related Art 7'). However, the Related Art 7 has a problem in that an additional process of applying a bonding material having an adhesive force to bonding surfaces of the pick-up heads is required to transfer micro LEDs.

In order to solve the problems of the related arts described above, it is necessary to solve the above-mentioned problems while adopting the basic principles adopted in the related arts. However, there is a limit to solving the problems because such problems are derived from the basic principles adopted in the related arts. Therefore, applicants of the present invention have not only solved the problems of the related arts but also proposed an advanced method which has not been considered in the related arts.

Individual micro LEDs grown on a growth substrate have lengths of several tens of micrometers and are arranged in the form of an m-by-n matrix with a pitch distance of several tens of micrometers or less. In order to grip and transfer the micro LEDs all at once which are arranged in the form of the m-by-n matrix, it is required to form suction holes having a width of several tens of micrometers or less in a vacuum plate. In addition, the suction holes are required to be configured with a pitch distance being equal to the pitch distance of the micro LEDs. In other words, in order to vacuum-suck all of the micro LEDs arranged in the form of the m-by-n matrix on a substrate, it is required to form the suction holes arranged in the m-by-n matrix.

Here, in order to form the suction holes in the vacuum plate, an additional process such as using a laser or etching is required to be performed. In order to form the suction holes having a fine width by using a laser or etching, a thin vacuum plate is required to be used. In the case the suction holes are formed to correspond to the micro LEDs one-to-one which are arranged in the form of the m-by-n matrix on the substrate, the pitch distance of the suction holes are required to be equal to the short pitch distance of the micro LEDs.

As described above, when forming the suction holes to correspond to the micro LEDs one-to-one which are arranged in form of the m-by-n matrix on the substrate, rigidity of the vacuum plate is greatly reduced, and the vacuum plate is liable to be bent or broken. Thus, even the suction holes are formed in the form of the m-by-n matrix, the micro LEDs may not be gripped.

Unlike a transfer head using electrostatic force, magnetic force, van der Waals force, or adhesive force, in the case of a transfer head using vacuum-suction force, when forming the suction holes penetrating the vacuum plate, the inside of the vacuum plate is reduced by the volume occupied by the suction holes, so that the rigidity of the vacuum plate is reduced. Therefore, in the case of the transfer head using vacuum-suction force, there is a contradictory problem that, although the suction holes are formed to vacuum-suck micro LEDs, the suction holes have a negative effect reducing stiffness of the suction plate.

Documents of Related Art (Patent Document 1) Korean Patent No. 10-0731673;
(Patent Document 2) Korean Patent Application Publication No. 10-2014-0112486;
(Patent Document 3) Korean Patent Application Publication No. 10-2017-0019415;
(Patent Document 4) Korean Patent No. 10-1754528;
(Patent Document 5) Korean Patent No. 10-1757404;
(Patent Document 6) Korean Patent Application Publication No. 10-2017-0026959; and
(Patent Document 7) Korean Patent Application Publication No. 10-2017-0024906.

SUMMARY OF THE INVENTION

Accordingly, the present invention has been made keeping in mind the above problems occurring in the related art, and an objective of the present invention is to provide a micro LED transfer head solving a problem that a strength of a member gripping micro LEDs with fine pores is reduced, thereby improving efficiency of transferring the micro LEDs.

In order to achieve the above objective, there is provided a micro LED transfer head including: a grip member gripping a micro LED with a vacuum-suction force. The grip member is constituted by stacking multiple layers, and vertical suction holes of the respective layers of the grip member are configured in a manner corresponding to each other.

The grip member may include an anodic oxide film formed by anodizing a metal.

The grip member may be configured such that a width of the suction holes is increased in an upward direction.

A vacuum chamber may be provided on the grip member.

A porous member may be positioned on and coupled to the grip member.

As described above, the micro LED transfer head according to the present invention solves a problem that strength of a member gripping micro LEDs with fine pores is reduced, thereby preventing deformation of the member gripping the micro LEDs. Accordingly, vacuum pressure gripping the micro LEDs can be generated properly, thereby improving the efficiency of transferring the micro LEDs.

BRIEF DESCRIPTION OF THE DRAWINGS

The above and other objects, features and other advantages of the present invention will be more clearly understood from the following detailed description when taken in conjunction with the accompanying drawings, in which:

FIG. 5 is a view illustrating a micro LED transfer head according to a second embodiment of the present invention.

DETAILED DESCRIPTION OF THE INVENTION

Figure 1:
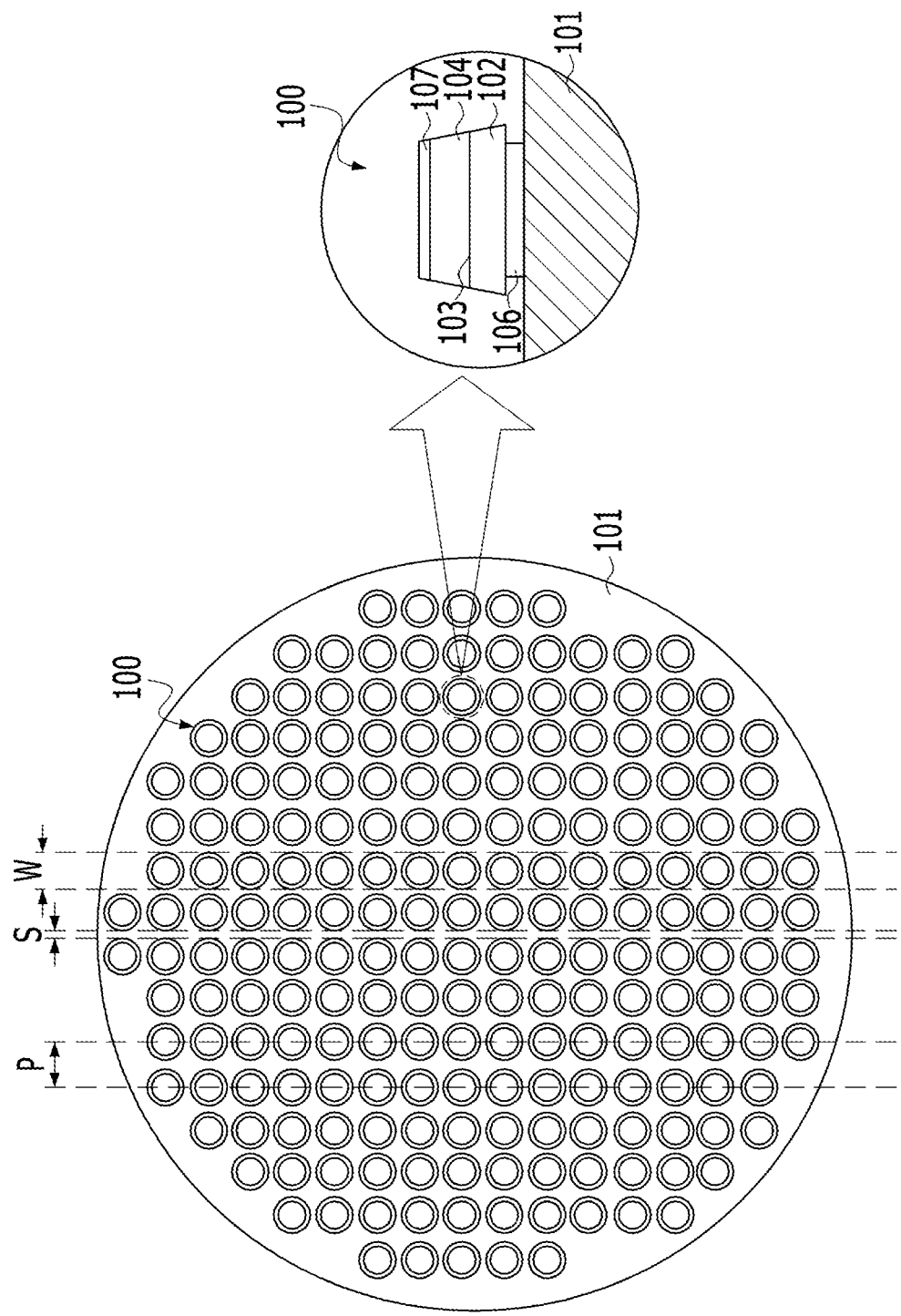
FIG. 1 is a view illustrating micro LEDs to be transferred according to an embodiment of the present invention.

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited to the exemplary embodiments and the conditions.

The above described objectives, features, and advantages will be more apparent through the following detailed description related to the accompanying drawings, and thus those of ordinary skill in the art may easily implement the technical spirit of the invention.

The embodiments of the present invention are described with reference to cross-sectional views and/or perspective views which schematically illustrate ideal embodiments of the present invention. For explicit and convenient description of the technical content, sizes or thicknesses of films and regions and diameters of holes in the figures may be exaggerated. Therefore, variations from the shapes of the illustrations as a result, for example, of manufacturing techniques and/or tolerances, are to be expected. In addition, a limited number of multiple micro LEDs are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

Hereinafter, a first embodiment of the present invention will be described in detail with reference to the accompanying drawings.

FIG. 1 is a view illustrating multiple micro LEDs 100 to be transferred by a micro LED transfer head according to the embodiment of the present invention. The micro LEDs 100 are fabricated and disposed on a growth substrate 101.

The growth substrate 101 may be embodied by a conductive substrate (P) or an insulating substrate (P). For example, the growth substrate 101 is made of at least one selected from among the group consisting of sapphire, SiC, Si, GaAs, GaN, ZnO, GaP, InP, Ge, and $Ga_2O_3$.

Each of the micro LEDs 100 includes: a first semiconductor layer 102; a second semiconductor layer 104; an active layer 103 provided between the first semiconductor layer 102 and the second semiconductor layer 104; a first contact electrode 106; and a second contact electrode 107.

The first semiconductor layer 102, the active layer 103, and the second semiconductor layer 104 may be formed by performing metalorganic chemical vapor deposition (MOCVD), chemical vapor deposition (CVD), plasma-enhanced chemical vapor deposition (PECVD), molecular-beam epitaxy (MBE), hydride vapor phase epitaxy (HVPE), or the like.

The first semiconductor layer 102 may be implemented, for example, as a p-type semiconductor layer. A p-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, AlInN, and the like, and the layer may be doped with a p-type dopant such as Mg, Zn, Ca, Sr, and Ba.

The second semiconductor layer 104 may be implemented, for example, as an n-type semiconductor layer. An n-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InNInAlGaN, AlInN, and the like, and the layer may be doped with an n-type dopant such as Si, Ge, and Sn.

However, the present invention is not limited to this. The first semiconductor layer 102 may be implemented as an n-type semiconductor layer, and the second semiconductor layer 104 may be implemented as a p-type semiconductor layer.

The active layer 103 is a region where electrons and holes are recombined. As the electrons and the holes are recombined, the active layer 103 transits to a low energy level and generates light having a wavelength corresponding thereto. The active layer 103 may be made of a semiconductor material having a composition formula of $In_xAl_yGa_{1-x-y}N$ ($0 \leq x \leq 1$, $0 \leq y \leq 1$, $0 \leq x+y \leq 1$) and may have a single quantum well structure or a multi quantum well (MQW) structure. In addition, the active layer 103 may have a quantum wire structure or a quantum dot structure.

The first semiconductor layer 102 may be provided with the first contact electrode 106, and the second semiconductor layer 104 may be provided with the second contact electrode 107. The first contact electrode 106 and/or the second contact electrode 107 may include one or more layers and may be made of various conductive materials including a metal, conductive oxide, and conductive polymer.

The multiple micro LEDs 100 formed on the growth substrate 101 are separated into individual pieces by cutting along a cutting line using a laser or the like or by etching. Then, it is possible to separate the individual micro LEDs 100 from the growth substrate 101 by a laser lift-off process.

In FIG. 1, the letter 'P' denotes a pitch distance between the micro LEDs 100, 'S' denotes a separation distance between the micro LEDs 100, and 'W' denotes a width of each micro LED 100.

Figure 2:
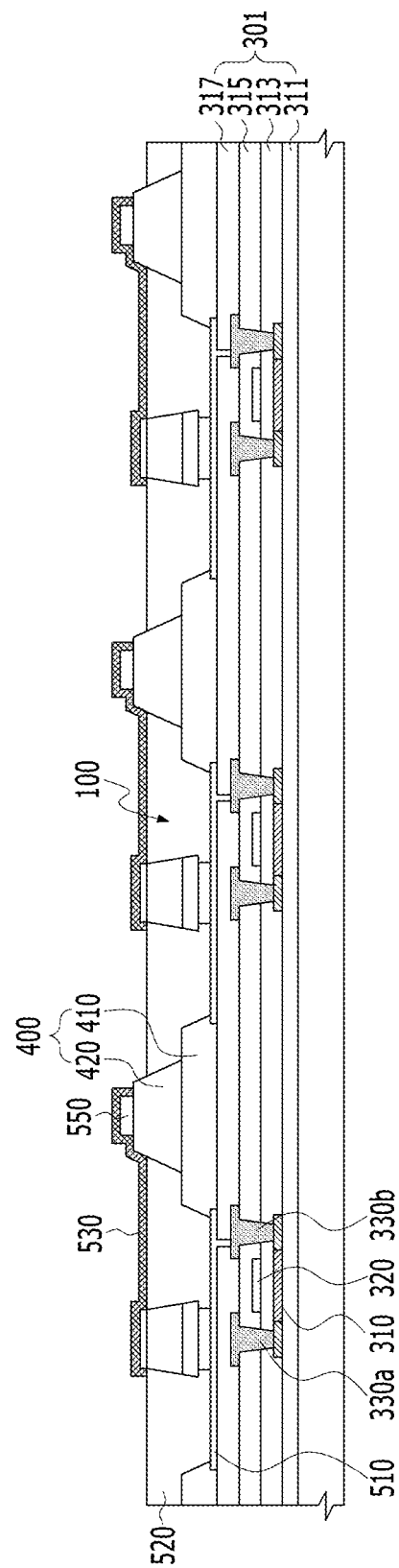
FIG. 2 is a view illustrating a micro LED structure in which the micro LEDs are transferred and mounted to a display substrate according to an embodiment of the present invention.

FIG. 2 is a view illustrating a micro LED structure in which the micro LEDs are transferred and mounted to a display substrate by the micro LED transfer head according to the embodiment of the present invention.

A display substrate 301 may include various materials. For example, the display substrate 301 may be made of a transparent glass material having $SiO_2$ as a main component.

However, materials of the display substrate 301 are not limited to this, and the display substrate 301 may be made of a transparent plastic material and have solubility. The plastic material may be an organic insulating substance selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

In the case of a bottom emission type in which an image is implemented in a direction of the display substrate 301, the display substrate 301 is required to be made of a transparent material. However, in the case of a top emission type in which an image is implemented in a direction opposite to the display substrate 301, the display substrate 301 is not required to be made of a transparent material. In this case, the display substrate 301 may be made of metal.

In the case of forming the display substrate 301 using metal, the display substrate 301 may be made of at least one metal selected from among the group consisting of iron, chromium, manganese, nickel, titanium, molybdenum, stainless steel (SUS), Invar, Inconel, and Kovar, but is not limited thereto.

The display substrate 301 may include a buffer layer 311. The buffer layer 311 provides a flat surface and blocks foreign matter or moisture from penetrating therethrough. For example, the buffer layer 311 may be made of an inorganic substance such as silicon oxide, silicon nitride, silicon oxynitride, aluminum oxide, aluminum nitride, titanium oxide, and titanium nitride, or an organic substance such as polyimide, polyester, and acrylic. Alternatively, the buffer layer 311 may be formed in a stacked manner with the exemplified substances.

A thin-film transistor (TFT) may include an active layer 310, a gate electrode 320, a source electrode 330a, and a drain electrode 330b.

Hereinafter, a case where a TFT is a top gate type in which the active layer 310, the gate electrode 320, the source electrode 330a, and the drain electrode 330b are sequentially formed will be described. However, the present embodiment is not limited thereto, and various types of TFTs such as a bottom gate TFT may be employed.

The active layer 310 may contain a semiconductor material, such as amorphous silicon and polycrystalline silicon. However, the present embodiment is not limited thereto, and the active layer 310 may contain various materials. As an alternative embodiment, the active layer 310 may contain an organic semiconductor material or the like.

As another alternative embodiment, the active layer 310 may contain an oxide semiconductor material. For example, the active layer 310 may contain an oxide of a metal element selected from Groups 12, 13, and 14 elements such as zinc (Zn), indium (In), gallium (Ga), tin (Sn), cadmium (Cd), and germanium (Ge), and a combination thereof.

A gate dielectric layer 313 is formed on the active layer 310. The gate dielectric layer 313 serves to isolate the active layer 310 and the gate electrode 320. The gate dielectric layer 313 may be formed into a multilayer or a single layer of a film made of an inorganic substance such as silicon oxide and/or silicon nitride.

The gate electrode 320 is provided on the gate dielectric layer 313. The gate electrode 320 may be connected to a gate line (not illustrated) applying an on/off signal to the TFT.

The gate electrode 320 may be made of a low-resistivity metal. In consideration of adhesion with an adjacent layer, surface flatness of layers to be stacked, and processability, the gate electrode 320 may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer dielectric film 315 is provided on the gate electrode 320. The interlayer dielectric film 315 isolates the source electrode 330a, the drain electrode 330b, and the gate electrode 320. The interlayer dielectric film 315 may be formed into a multilayer or single layer of a film made of an inorganic substance. For example, the inorganic substance may be a metal oxide or a metal nitride. Specifically, the inorganic substance may include silicon dioxide ($SiO_2$), silicon nitrides ($SiN_x$), silicon oxynitride (SiON), aluminum oxide ($Al_2O_3$), titanium dioxide ($TiO_2$), tantalum pentoxide ($Ta_2O_5$), hafnium dioxide ($HfO_2$), or zirconium dioxide ($ZrO_2$).

The source electrode 330a and the drain electrode 330b are provided on the interlayer dielectric film 315. The source electrode 330a and the drain electrode 330b may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode 330a and the drain electrode 330b are electrically connected to a source region and a drain region of the active layer 310, respectively.

A planarization layer 317 is provided on the TFT. The planarization layer 317 is configured to cover the TFT, thereby eliminating steps caused by the TFT and planarizing the top surface. The planarization layer 317 may be formed into a single layer or a multilayer of a film made of an organic substance. The organic substance may include a general-purpose polymer such as polymethyl methacrylate (PMMA) and polystyrene (PS); a polymer derivative having phenols; polyacrylates; polyimides, poly(aryl ethers); polyamides; fluoropolymers; poly-p-xylenes; and polyvinyl alcohols; and a combination thereof. In addition, the planarization layer 317 may be formed into a multi-stack including an inorganic insulating layer and an organic insulating layer.

A first electrode 510 is provided on the planarization layer 317. The first electrode 510 may be electrically connected to the TFT. Specifically, the first electrode 510 may be electrically connected to the drain electrode 330b through a contact hole formed in the planarization layer 317. The first electrode 510 may have various shapes. For example, the first electrode 510 may be patterned in an island layout. A bank layer 400 defining a pixel region may be disposed on the planarization layer 317. The bank layer 400 may include a recess where each of the micro LEDs 100 will be received. The bank layer 400 may include, for example, a first bank layer 410 defining the recess. A height of the first bank layer 410 may be determined by a height and viewing angle of the micro LED 100. A size (width) of the recess may be determined by resolution, pixel density, and the like, of a display device. In an embodiment, the height of the micro LED 100 may be greater than the height of the first bank layer 410. The recess may have a quadrangular cross section, but is not limited to this. The recess may have various cross section shapes, such as polygonal, rectangular, circular, conical, elliptical, and triangular.

The bank layer 400 may further include a second bank layer 420 on the first bank layer 410. The first bank layer 410 and the second bank layer 420 have a step difference, and a width of the second bank layer 420 may be smaller than the width of the first bank layer 410. A conductive layer 550 may be disposed on the second bank layer 420. The conductive layer 550 may be disposed in a direction parallel to a data line or a scan line, and may be electrically connected to a second electrode 530. However, the present invention is not limited thereto. The second bank layer 420 may be omitted, and the conductive layer 550 may be disposed on the first bank layer 410. Alternatively, the second bank layer 420 and the conductive layer 550 may be omitted, and the second electrode 530 may be formed over the entire display substrate (P) such that the second electrode 530 serves as a shared electrode that pixels share. The first bank layer 410 and the second bank layer 420 may include a material absorbing at least a part of light, a light reflective material, or a light scattering material. The first bank layer 410 and the second bank layer 420 may include an insulating material that is translucent or opaque to visible light (e.g., light in a wavelength range of 380 nm to 750 nm).

For example, the first bank layer 410 and the second bank layer 420 may be made of a thermoplastic such as polycarbonate (PC), polyethylene terephthalate (PET), polyethersulfone, polyvinyl butyral, polyphenylene ether, polyamide, polyetherimide, polynorbornene, poly(methyl methacrylate) resin, and cyclic polyolefin resin; a thermosetting plastic such as epoxy resin, phenolic resin, urethane resin, acrylic resin, vinyl ester resin, polyimide resin, urea resin, and melamine resin; or an organic insulating substance such as polystyrene, polyacrylonitrile, and polycarbonate, but are not limited thereto.

As another example, the first bank layer 410 and the second bank layer 420 may be made of an inorganic insulating substance such as inorganic oxide and inorganic nitride including $SiO_x$, $SiN_x$, $SiN_xO_y$, $AlO_x$, $TiO_x$, $TaO_x$, and $ZnO_x$, but are not limited thereto. In an embodiment, the first bank layer 410 and the second bank layer 420 may be made of an opaque material such as a material of a black matrix. A material of the insulating black matrix may include a resin or a paste including organic resin, glass paste, and black pigment; metal particles such as nickel, aluminum, molybdenum, and alloys thereof; metal oxide particles (e.g., chromium oxide); metal nitride particles (e.g., chromium nitride); or the like. In an alternate embodiment, the first bank layer 410 and the second bank layer 420 may be a distributed Bragg reflector (DBR) having high reflectivity or a mirror reflector made of metal.

Each of the micro LEDs 100 is disposed in each recess. The micro LED 100 may be electrically connected to the first electrode 510 at the recess.

The micro LED 100 emits light having wavelengths of different colors such as red, green, blue, white, and the like. With the micro LED 100, it is possible to realize white light by using fluorescent materials or by combining colors. The micro LED 100 has a size of 1 μm to 100 μm. The micro LEDs 100 are picked up from the growth substrate 101 individually or collectively by a transfer head according to the embodiment of the present invention, transferred to the display substrate 301, and received in the recess of the display substrate 301.

The micro LED 100 includes a p-n diode, the first contact electrode 106 disposed on one side of the p-n diode, and the second contact electrode 107 disposed on the opposite side of the first contact electrode 106. The first contact electrode 106 may be connected to the first electrode 510, and the second contact electrode 107 may be connected to the second electrode 530.

The first electrode 510 may include: a reflective layer made of Ag, Mg, Al, Pt, Pd, Au, Ni, Nd, Ir, Cr, or a compound thereof; and a transparent or translucent electrode layer provided on the reflective layer. The transparent or translucent electrode layer may be made of at least one selected from among the group consisting of indium tin oxide (ITO), indium zinc oxide (IZO), zinc oxide (ZnO), indium oxide ($In_2O_3$), indium gallium oxide (IGO), and aluminum zinc oxide (AZO).

A passivation layer 520 surrounds the micro LED 100 in the recess. The passivation layer 520 covers the recess and the first electrode 510 by filling a space between the bank layer 400 and the micro LED 100. The passivation layer 520 may be made of an organic insulating substance. For example, the passivation layer 520 may be made of acrylic, poly (methyl methacrylate) (PMMA), benzocyclobutene (BCB), polyimide, acrylate, epoxy, and polyester, but is not limited thereto.

The passivation layer 520 is formed to have a height not covering an upper portion of the micro LED 100, for example, a height not covering the second contact electrode 107, whereby the second contact electrode 107 is exposed. The second electrode 530 may be formed on the passivation layer 520 electrically connected to the exposed second contact electrode 107 of the micro LED 100.

The second electrode 530 may be disposed on the micro LED 100 and the passivation layer 520. The second electrode 530 may be made of a transparent conductive substance such as ITO, IZO, ZnO, and $In_2O_3$.

Hereinbelow, a micro LED transfer head 1000 according to a first embodiment of the present invention will be described with reference to FIG. 3.

Figure 3:
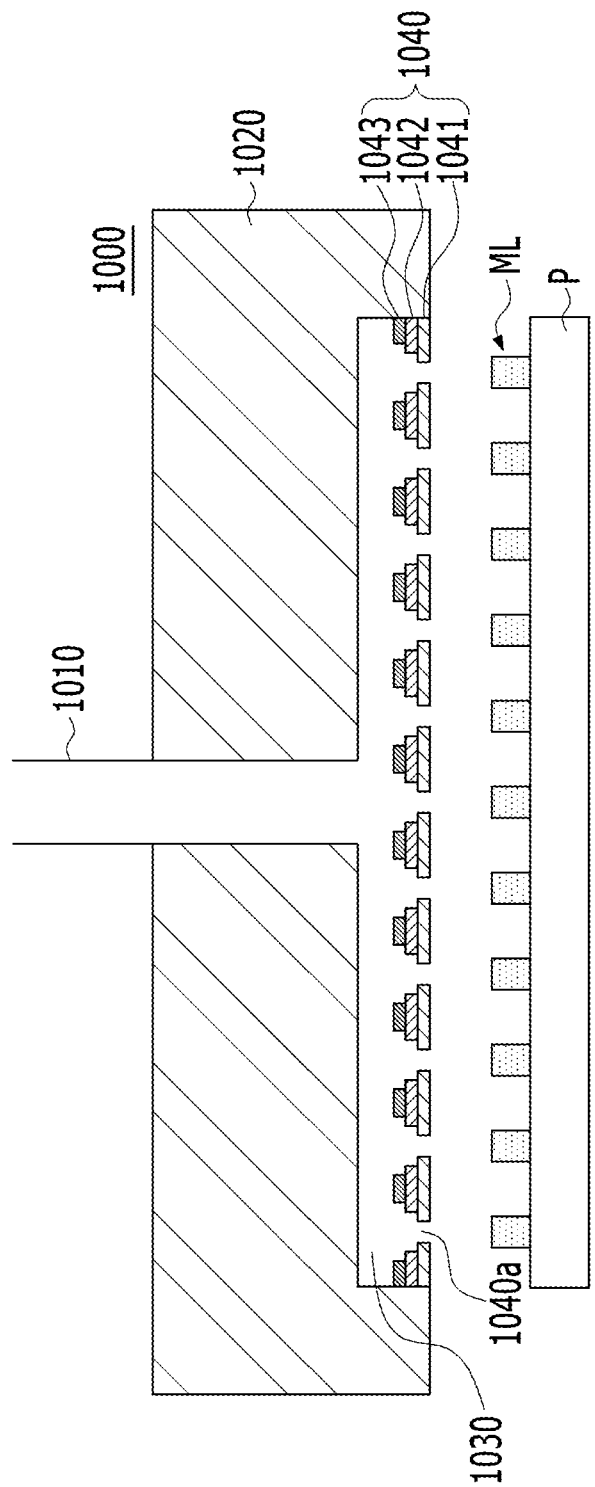
FIG. 3 is a view illustrating a micro LED transfer head according to a first embodiment of the present invention.

FIG. 3 is a view illustrating the micro LED transfer head 1000 according to the first embodiment of the present invention. The micro LED transfer head 1000 according to the first embodiment of the present invention includes: a grip member 1040 gripping micro LEDs (ML) with vacuum-suction force; a vacuum chamber 1030 provided on the grip member 1040; and a support member 1020 fixing and supporting the grip member 1040. Accordingly, the micro LED transfer head 1000 grips and transports the micro LEDs (ML) of a substrate (P). Here, the substrate (P) may be the growth substrate 101 of FIG. 1 or the display substrate 301.

The grip member 1040 is configured with suction holes 1040a vertically formed such that the micro LEDs (ML) are gripped by the vacuum-suction force.

The grip member 1040 may be made of a material such as a metal, a non-metal, a ceramic, a glass, quartz, a silicone (PDMS), or a resin as long as the suction holes 1040a can be formed to have a width of several tens of micrometers or less. In the case the grip member 1040 is made of a metal, it is possible to prevent the generation of static electricity during the transfer of the micro LEDs (ML). In the case the grip member 1040 is made of a non-metal, it is possible to minimize the influence of the grip member 1040 on the micro LEDs (ML) having the property of metal. In the case the grip member 1040 is made of a ceramic, a glass, quartz, or the like, it is possible to secure rigidity and minimize a positional error due to a low thermal expansion coefficient thereof, which may occur due to thermal deformation of the grip member 1040 during the transfer of the micro LEDs (ML). In the case the grip member 1040 is made of a silicone (PDMS), it is possible to function as a buffer and minimize damage which may be caused by collision between a lower surface of the grip member 1040 and upper surfaces of the micro LEDs (ML). In the case the grip member 1040 is a resin, it is possible to facilitate the manufacture of the grip member 1040.

The grip member 1040 is configured with the suction holes 1040a. The suction holes 1040a of the grip member 1040 are configured to grip the micro LEDs (ML) onto a grip surface of the grip member 1040. The suction holes 1040a are configured to extend from top to bottom of the grip member 1040 using a laser, etching, or the like.

The grip member 1040 configured with the vertical suction holes 1040a is constituted by stacking multiple layers.

The grip member 1040 may be formed into thin plates so as to easily form the vertical suction holes 1040a using a laser, etching, or the like. However, since the grip member 1040 is thin, the rigidity thereof may be reduced. According to the present invention, as the grip member 1040 configured with the suction holes 1040a is constituted by stacking the multiple layers having the form of thin plates, it is possible to prevent the rigidity of the grip member 1040 from being reduced. For example, in order to increase rigidity of a grip member, a grip member thicker than the grip member having the form of thin plates may be prepared, and the grip member may be configured with vertical suction holes. However, it may be difficult to form the vertical suction holes in the thick grip member compared with the grip member having the form of thin plates. When forming the suction holes using a laser, etching, or the like, the suction holes are formed such that the width thereof becomes narrow toward the bottom of the grip member. Therefore, it may be difficult to form the suction holes with the same width in the grip member. In the case of the thick grip member, the depth of the suction holes are formed to be deep as the thickness of the grip member, and the suction holes are formed such that the width thereof becomes narrow toward the bottom of the grip member. Accordingly, the difference between a lower width and an upper width of the suction holes may be large. The suction holes are required to be provided in the grip member in the number corresponding to the micro LED (ML) in order to grip the micro LEDs (ML). However, since the grip member is thick, the suction holes are not formed vertically with the same width, and the difference between the lower width and the upper width thereof may be large. In this case, an upper width of a suction hole corresponding to one micro LED (ML) may intrude a suction hole forming region where another suction hole corresponding to another micro LED (ML) is to be formed. In other words, in the case of the thick grip member, the suction holes may not be configured in the grip member in a manner corresponding to the individual micro LEDs (ML) to be gripped. Therefore, according to the present invention, the grip member 1040 in the form of thin plates in which the suction holes 1040a are easily formed is prepared to form the suction holes 1040a vertically in the respective layers of the grip member 1040 in a manner corresponding to the micro LEDs (ML). In addition, as the grip member 1040 configured with the suction holes 1040a is constituted by stacking the multiple layers, it is possible to prevent the rigidity of the grip member 1040 from being reduced by the thin thickness thereof.

As illustrated in FIG. 3, the grip member 1040 configured with the vertical suction holes 1040a is constituted by stacking multiple layers, and the vertical suction holes 1040a of the respective layers of the grip member 1040 are configured in a manner corresponding to each other. Hereinafter, for the sake of ease of explanation of the present invention, it is assumed that the multiple layers of the grip member 1040 being brought into direct contact with the micro LEDs (ML) and gripping the micro LEDs (ML) onto the grip surface are a first grip layer 1041, a second grip layer 1042 stacked on the first grip layer 1041, and a third grip layer 1043 stacked on the second grip layer 1042.

The grip member 1040 may be constituted by the first grip layer 1041 on which the micro LEDs (ML) are gripped, the second grip layer 1042 stacked on the first grip layer 1041, and the third grip layer 1043 stacked on the second grip layer 1042. In this case, although FIG. 3 illustrates the grip member 1040 being constituted by stacking the first grip layer 1041, the second grip layer 1042, and the third grip layer 1043, the grip member 1040 constituted by the multiple layers is not limited thereto.

Since the second grip layer 1042 is stacked on the first grip layer 1041 and the third grip layer 1043 is stacked on the second grip layer 1042, the grip member 1040 is configured such that the first grip layer 1041, the second grip layer 1042, and the third grip layer 1043 may be sequentially arranged in an upward direction.

The first grip layer 1041 is configured with vertical suction holes 1040a. Vertical suction holes 1040a are also configured in the second grip layer 1042 and the third grip layer 1043. In this case, the suction holes 1040a of the respective layers of the grip member 1040 are configured in a manner corresponding to each other. As illustrated in FIG. 3, the suction holes 1040a of the second grip layer 1042 are configured in a manner corresponding to the suction holes 1040a of the first grip layer 1041, and the suction holes 1040a of the third grip layer 1043 are configured in a manner corresponding to the suction holes 1040a of the second grip layer 1042.

The suction holes 1040a of the respective layers of the grip member 1040 which are configured in a manner corresponding to each other are configured such that the width of the suction holes 1040a is increased in the upward direction. The width of the suction holes 1040a of the first grip layer 1041 may be smaller than a horizontal width of an upper surface of each of the micro LEDs. The suction holes 1040a of the second grip layer 1042 which correspond to the suction holes 1040a of the first grip layer 1041 are configured to have a larger width than the suction holes 1040a of the first grip layer 1041, and the suction holes 1040a of the third grip layer 1043 which correspond to the suction holes 1040a of the second grip layer 1042 are configured to have a larger width than the suction holes 1040a of the second grip layer 1042. With respect to the first grip layer 1041, the suction holes 1040a of the grip member 1040 are configured such that the width of the suction holes 1040a is increased in the upward direction. With respect to the third grip layer 1043, the suction holes 1040a of the grip member 1040 are configured such that the width of the suction holes 1040a is decreased in a downward direction. The suction holes 1040a in which the width thereof is decreased with respect to the suction holes 1040a of the third grip layer 1043 concentrate vacuum pressure dispersed in the wide width, thereby facilitating formation of high vacuum-suction force for gripping the micro LEDs (ML).

In addition, in the case the width of the suction holes 1040a of the grip member 1040 is configured to increase in the upward direction, it is easy to align the suction holes 1040a to be concentric with each other when stacking the multiple layers of the grip member 1040. When stacking the multiple layers of the grip member 1040, the suction holes 1040a of the grip member 1040 are aligned. Here, a central axis of the suction holes 1040a of the first grip layer 1041 may serve as a reference axis, the first grip layer 1041 being brought in direct contact with the micro LEDs (ML) and configured with the suction holes 1040a gripping the micro LEDs (ML). Since the suction holes 1040a of the first grip layer 1041 are configured such that the width thereof is smaller than the horizontal width of the upper surface of each of the micro LEDs (ML), the width thereof may be very small. In the case the width of the suction holes 1040a is configured to be increased in the upward direction and a reference suction hole 1040a is defined as one of the suction holes 1040a which has the reference axis, the width of one of the suction holes 1040a (hereinafter, referred to as an upper suction hole 1040a) which is located on or above the reference suction hole 1040a is configured to be larger than the width of the reference suction hole 1040a. Thus, a range in which mechanical tolerance can be accommodated may be wide when aligning the suction holes 1040a to be concentric with each other with respect to the central axis of the reference suction hole 1040a. In other words, since the width of the upper suction hole 1040a is larger than the width of the reference suction hole 1040a, when moving the upper suction hole 1040a to align with the reference suction hole 1040a such that the upper suction hole 1040a and the reference suction hole 1040a are concentric with each other, it is possible to position the reference suction hole 1040a within the width of the upper suction hole 1040a even though the upper suction hole 1040a and the reference suction hole 1040a are not aligned precisely due to mechanical tolerance so that same are not concentric with each other. As a result, it is possible to align the suction holes 1040a and discharge air effectively, so that the micro LEDs (ML) are easily gripped.

In addition, when the grip member 1040 configured such that the width of the suction holes 1040a is increased in the upward direction grips the micro LEDs (ML) formed on the substrate (P) onto the grip surface, the gripping of the micro LEDs (ML) can be performed even though the micro LED transfer head 1000 has a low alignment accuracy with respect to the micro LEDs (ML). However, in the case of a grip member configured such that the width of suction holes is decreased in the upward direction, when the micro LED transfer head has a low alignment with respect to the micro LEDs (ML), the micro LEDs (ML) are not gripped due to the outside air flowing into the suction holes. In other words, in the case of the micro LED transfer head being provided with the grip member configured such that the width of suction holes is decreased in the upward direction, a high alignment accuracy of the micro LED transfer head may be required. However, it may be difficult to move the micro LED transfer head to a desired position due to mechanical tolerance. As a result, the micro LED transfer head may not grip the micro LEDs (ML) well. According to the present invention, the grip member 1040 is provided, which is configured with the suction holes 1040a brought into direct contact with the micro LEDs (ML) to grip the micro LEDs (ML). The suction holes are configured such that the width thereof is smaller than the width of the upper surface of each of the micro LEDs (ML) and configured to increase in the upward direction. Thus, even though the micro LED transfer head 1000 has low alignment accuracy with respect to the micro LEDs (ML), the micro LEDs (ML) can be gripped onto the suction holes 1040a, thereby improving efficiency of transferring the micro LEDs (ML).

Among the layers of the grip member 1040 of the micro LED transfer head 1000, a layer in which the width of suction holes 1040a is configured to be larger than the horizontal width of the upper surface of each of the micro LEDs (ML) may have decreased rigidity. However, the layer of the grip member 1040 may be a layer (for example, the second grip layer 1042 or the third grip layer 1043) stacked on another layer (for example, the first grip layer 1041) being brought into direct contact with the micro LEDs (ML) so that a part where the suction holes 1040a are configured and thus rigidity is weak can be reinforced as the multiple layers are stacked to constitute the grip member 1040.

With respect to the grip member 1040 constituted by multiple layers, multiple layers of the same material may be stacked on one another or multiple layers of different materials may be stacked on one another. In this case, the above-mentioned materials constituting the grip member 1040 may be used. Multiple layers of one material selected from the above-mentioned materials may be stacked on one another, or multiple layers of different materials selected from the above-mentioned materials may be stacked on one another.

As described above, since the micro LED transfer head 1000 is constituted by stacking the multiple layers configured with the vertical suction holes 1040a, it is possible to solve a problem of a grip member 1040 having a single layer and thus reduced rigidity. This prevents deformation of the grip member 1040 having the vertical suction holes 1040a and having low rigidity due to the thin plate shape thereof.

In addition, since the suction holes 1040a are configured vertically in the thin plate-shaped grip member 1040 and the suction holes 1040a are configured in the multiple layers of the grip member 1040, a formation width of the suction holes 1040a can be adjusted such that one of the suction holes 1040a on which one of the micro LEDs (ML) is gripped does not intrude a suction hole forming region where another suction hole on which one of the micro LEDs (ML) is gripped, the suction holes 1040a being configured in the grip member 1040 that is brought into direct contact with the micro LEDs (ML).

In addition, the efficiency of transferring the micro LEDs (ML) can be improved because it is possible to prevent a problem that vacuum pressure may not be properly formed in some of the suction holes 1040a due to a deformed grip member 1040 so that some of the micro LEDs (ML) are not gripped.

The vacuum chamber 1030 is provided on the grip member 1040. The vacuum chamber 1030 may be provided inside the support member 1020 and may be provided on the grip member 1040 while being spaced apart from an upper surface of the grip member 1040. The vacuum chamber 1030 and the pipe 1001 communicate with each other. When a vacuum pump (not illustrated) is operated, vacuum pressure is provided into the vacuum chamber 1030 through the pipe 1001, and the vacuum pressure is introduced into the suction holes 1040a through the vacuum chamber 1030. Accordingly, a vacuum-suction force is generated, and the suction holes 1040a vacuum-suck the micro LEDs (ML).

The micro LED transfer head 1000 is provided with the support member 1020 which fixes and supports the grip member 1040, and the grip member 1040 and the vacuum chamber 1030 provided on the grip member 1040 are protected thereby being exposed to the outside. The support member 1020 may be positioned on the grip member 1040 and the vacuum chamber 1030 provided on the grip member 1040. The support member 1020 may be configured in a shape covering the grip member 1040 and the vacuum chamber 1030. As described above, since the support member 1020 is configured in a shape covering the grip member 1040 and the vacuum chamber 1030, the grip member 1040 and the vacuum chamber 1030 are structured as being provided inside the support member 1020 so that the support member 1020 can function as a housing. The support member 1020 may be made of a metal such as aluminum (Al) but is not limited as long as the support member 1020 can fix and support the grip member 1040. In addition, a structure in which the support member 1020 is provided on or above the grip member 1040 and the vacuum chamber 1030 provided on the grip member 1040 is not limited thereto.

Figure 4:
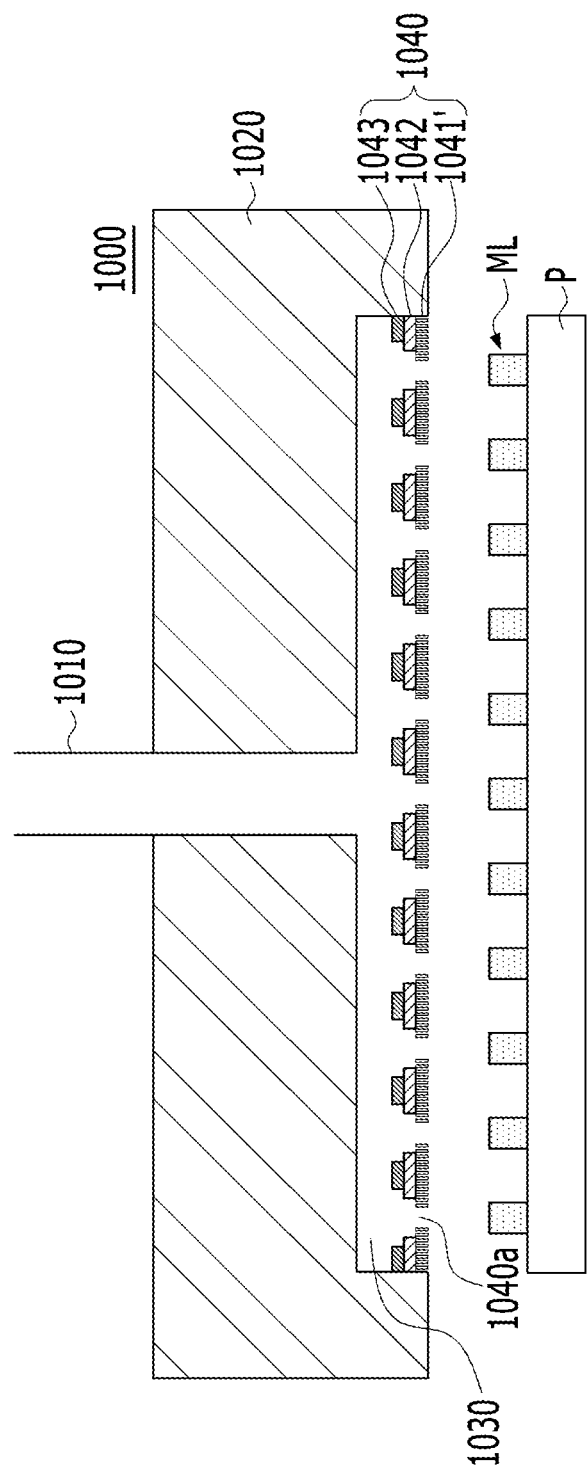
FIG. 4 is a view illustrating a modification of the micro LED transfer head of FIG. 3.

FIG. 4 is a view illustrating a modification of the micro LED transfer head 1000 according to the first embodiment of the present invention. The modification of the first embodiment differs from the first embodiment in that a grip member 1040 included in the micro LED transfer head 1000 of the modification of the first embodiment includes an anodic oxide film formed by anodizing a metal.

As illustrated in FIG. 4, the grip member 1040 is constituted by stacking multiple layers configured with vertical suction holes 1040a. A first grip layer 1041' is an anodic oxide film, and a second grip layer 1042 and a third grip layer 1043 are porous grip layers configured with vertical suction holes 1040a. In the case of the multiple layers of the grip member 1040 being stacked on one another, FIG. 4 illustrates the modification of the micro LED transfer head 1000 that only the first grip layer 1041' is an anodic oxide film, and the second grip layer 1042 and third grip layer 1043 which are stacked on the first grip layer 1041 are made of materials different from that of the first grip layer 1041'. However, the grip member 1040 may be constituted by stacking multiple anodic oxide films.

The anodic oxide film is a film formed by anodizing a metal that is a base material, and pores of the anodic oxide film are pores formed in a process of forming the anodic oxide film by anodizing the metal. For example, in the case that the base metal is aluminum (Al) or an aluminum alloy, the anodization of the base material forms the anodic oxide film consisting of anodized aluminum ($Al_2O_3$) on a surface of the base material. The anodic oxide film formed as described above includes a barrier layer in which pores are not formed and a porous layer in which the pores are formed inside. The barrier layer is positioned on an upper portion of the base material, and the porous layer is positioned on the barrier layer. After removing the base material on which the anodic oxide film having the barrier layer and the porous layer is formed, only an anodic oxide film consisting of anodized aluminum ($Al_2O_3$) remains. The anodic oxide film has the pores configured vertically and having a regular arrangement with a uniform diameter. Accordingly, after removing the barrier layer, the pores have a structure extending from top to bottom, thereby facilitating the generation of the vacuum pressure in the vertical direction.

The inside of the anodic oxide film forms air flow paths vertically by the vertical pores. An internal width of the pores has a size of several nanometers to several hundred nanometers.

When such anodic oxide film is etched by using a mask, the vertical suction holes 1040a are formed at the etched portion. The suction holes 1040a are formed such that the width thereof is greater than pores formed naturally in the anodic oxide film. In the case the anodic oxide film is used as the grip member 1040, it is possible to easily form the suction holes 1040a in the vertical direction on the basis of an aspect that it is possible to form vertical holes by using reaction between the anodic oxide film and an etching solution.

The thermal expansion coefficient of the anodic oxide film is 2 ppm/° C. to 3 ppm/° C. Thus, it is possible to minimize the thermal deformation of the anodic oxide film caused by peripheral heat when the modification of the micro LED transfer head 1000 grips and transfers the micro LEDs (ML), thereby lowering positional error remarkably.

Hereinbelow, a micro LED transfer head 1000 according to a second embodiment of the present invention will be described with reference to FIG. 5.

FIG. 5 is a view illustrating the micro LED transfer head 1000 according to the second embodiment of the present invention. The micro LED transfer head 1000 according to the second embodiment differs from the micro LED transfer head 1000 according to the first embodiment in that a porous member 1050 according to the second embodiment is provided in a manner being positioned on and coupled to the grip member 1040, and the remaining configuration is the same. Therefore, a detailed description of the same configuration will be omitted.

As illustrated in FIG. 5, in the micro LED transfer head 1000 according to the second embodiment, the grip member 1040 is constituted by stacking the multiple layers configured with the suction holes 1040a.

The porous member 1050 is positioned on and coupled to the grip member 1040. The porous member 1050 may be provided inside the support member 1020 and may be positioned on and coupled to the grip member 1040 while being spaced apart from an upper surface of the grip member 1040. The porous member 1050 may be composed of a material containing a large number of pores therein and may be configured as a powder, a thin film, a thick film, or a bulk form which has a porosity of about 0.2 to 0.95 in a predetermined arrangement or disordered pore structure. The pores of the porous member 1050 are classified according to pore sizes thereof: micropores having a pore diameter of 2 nm or less, mesopores having a pore diameter of 2 nm to 50 nm, and macropores having a pore diameter of 50 nm or more. The porous member 1050 may include at least some of micropores, mesopores, and macropores. Porous materials of the porous member 1050 are classified according to constituent components thereof: organic, inorganic (ceramic), metal, or hybrid type. The porous member 1050 is configured into a powder, a coating film, or a bulk form. The powder may have various shapes such as a sphere, a hollow sphere, a fiber, and a tube. The powder may be used as it is in some cases, but it is also possible to prepare a coating film or a bulk form with the powder as a starting material.

When the pores of the porous member 1050 have the disordered pore structure, the multiple pores are connected to each other inside the porous member 1050 such that flow paths are formed and connect upper and lower portions of the porous member 1050. The porous member 1050 may become porous by sintering aggregate composed of inorganic granules and a binder that bonds aggregate. In this case, the multiple pores of the porous member 1050 are irregularly connected to each other to form gas flow paths, and the top and bottom surfaces of the porous member 1050 communicate with each other by the gas flow paths.

The porous member 1050 is provided between the pipe 1010 and the grip member 1400 to disperse suction force generated from the pipe 1010 in the horizontal direction and deliver the suction force to the grip member 1040. Accordingly, it is possible to uniformize the vacuum pressure applied to the suction holes 1040a of the grip member 1400 in which the multiple layers are stacked on one another.

In addition, the porous member 1050 has high rigidity and thus may function to support the grip member 1040 provided below the porous member 1050 in order to prevent deformation of the grip member 1040. Since the deformation of the grip member 1040 is prevented, it is possible to prevent changes in flatness of the grip member and thus to reliably generate vacuum pressure on all the micro LEDs (ML) and to allow the transfer head to grip all the micro LEDs (ML).

Although the invention has been described with reference to certain specific embodiments, various modifications, additions and substitutions thereof will be apparent to those skilled in the art without departing from the spirit and scope of the invention as outlined in the claims appended hereto.

What is claimed is:

1. A micro LED transfer head, comprising:
a support member;
a grip member provided under the support member for gripping a micro LED with a vacuum-suction force;
a vacuum chamber provided inside the support member and provided on the grip member; and
a porous member provided inside the vacuum chamber and positioned on the grip member,
wherein a lower surface of the porous member is positioned on an upper surface of the grip member,
wherein the grip member is constituted by stacking multiple layers, and vertical suction holes of the respective layers of the grip member are configured in a manner corresponding to each other.

2. The micro LED transfer head of claim 1, wherein the grip member includes an anodic oxide film formed by anodizing a metal.

3. The micro LED transfer head of claim 1, wherein the grip member is configured such that a width of the suction holes is increased in an upward direction.

* * * * *